(12) United States Patent
Kurosawa

(10) Patent No.: US 7,592,244 B2
(45) Date of Patent: Sep. 22, 2009

(54) SEMICONDUCTOR DEVICE AND METHOD OF MANUFACTURING THE SAME

(75) Inventor: Yasunori Kurosawa, Fujimi (JP)

(73) Assignee: Seiko Epson Corporation (JP)

( * ) Notice: Subject to any disclaimer, the term of this patent is extended or adjusted under 35 U.S.C. 154(b) by 315 days.

(21) Appl. No.: 11/396,998

(22) Filed: Apr. 3, 2006

(65) Prior Publication Data

US 2006/0223303 A1 Oct. 5, 2006

(30) Foreign Application Priority Data

Apr. 4, 2005 (JP) ............................. 2005-107314

(51) Int. Cl.
*H01L 21/4763* (2006.01)
(52) U.S. Cl. .......... 438/597; 228/180.22; 257/E23.019; 257/737; 257/738; 257/773; 257/779; 257/780; 257/781; 257/786
(58) Field of Classification Search ................. 257/737, 257/738, 773, 779, 780, 781, 786, E23.019; 228/180.22; 438/597
See application file for complete search history.

(56) References Cited

U.S. PATENT DOCUMENTS

| | | | | |
|---|---|---|---|---|
| 3,617,816 | A * | 11/1971 | Riseman et al. ............. | 361/160 |
| 6,235,552 | B1 * | 5/2001 | Kwon et al. ................ | 438/106 |
| 6,333,565 | B1 * | 12/2001 | Hashimoto .................. | 257/781 |
| 6,441,500 | B1 * | 8/2002 | Sumikawa et al. .......... | 257/780 |
| 6,555,908 | B1 * | 4/2003 | Eichelberger et al. ....... | 257/737 |
| 6,946,734 | B2 * | 9/2005 | Marcoux et al. ............ | 257/737 |
| 2003/0207494 | A1 * | 11/2003 | Suzuki et al. ............... | 438/107 |
| 2004/0115868 | A1 | 6/2004 | Ono | |
| 2004/0160299 | A1 * | 8/2004 | Marcoux et al. ............ | 336/200 |
| 2005/0006765 | A1 | 1/2005 | Kurosawa | |

FOREIGN PATENT DOCUMENTS

| | | |
|---|---|---|
| JP | 11-340369 | 12/1999 |
| JP | 2001-144217 | 5/2001 |
| JP | 2002-237546 | 8/2002 |
| JP | 2003-249597 | 9/2003 |
| JP | 2004-140115 | 5/2004 |
| JP | 2004-140116 | 5/2004 |
| JP | 2004-193456 | 7/2004 |
| JP | 2004/193497 | 7/2004 |
| JP | 2005/26301 | 1/2005 |
| JP | 2005-101248 | 4/2005 |
| JP | 2005-236318 | 9/2005 |

* cited by examiner

*Primary Examiner*—Eugene Lee
*Assistant Examiner*—Peniel M Gumedzoe
(74) *Attorney, Agent, or Firm*—Harness, Dickey & Pierce, P.L.C.

(57) ABSTRACT

A method of manufacturing a semiconductor device includes the step of forming a first insulating section with a protruding section on a semiconductor substrate, the step of forming a first conducting section on the first insulating section so as to pass on a surface of the protruding section, the step of forming a second insulating section for partially covering the first conducting section above the first insulating section so as to expose at least a part of the first conducting section formed on the surface of the protruding section, and the step of forming, on the second insulating section, a second conducting section electrically connected to the first conducting section via an exposed section of the first conducting section exposed from the second insulating section.

9 Claims, 7 Drawing Sheets

(A)

(B)

(C)

(A)

(B)

(A)

(B)

(A)

(B)

SEMICONDUCTOR DEVICE AND METHOD OF MANUFACTURING THE SAME

The entire disclosure of Japanese Patent Application No. 2005-107314, filed Apr. 4, 2005 is expressly incorporated by reference herein.

BACKGROUND OF THE INVENTION

1. Technical Field

The present invention relates to a semiconductor device and a method of manufacturing the semiconductor device.

2. Related Art

A semiconductor device having insulating layers stacked to form a multi-layer structure and wiring formed between the insulating layers is known. Further, it is also known that wirings on both surfaces of the insulating layer are formed to be connected to each other. JP-A-2004-193497 discloses such related art. In this case, if the wirings on both surfaces of the insulating layer can be electrically connected to each other firmly, a highly reliable semiconductor device can be manufactured.

SUMMARY

An advantage of the invention is to provide a highly reliable semiconductor device and a method of manufacturing the semiconductor device.

A method of manufacturing a semiconductor device according to an aspect of the invention includes the step of forming a first insulating section with a protruding section on a semiconductor substrate, the step of forming a first conducting section on the first insulating section so as to pass on a surface of the protruding section, the step of forming a second insulating section above the first insulating section for partially covering the first conducting section so as to expose at least a part of the first conducting section formed on the surface of the protruding section, and the step of forming, on the second insulating section, a second conducting section electrically connected to the first conducting section via an exposed section of the first conducting section exposed from the second insulating section. According to this aspect of the invention, at least a part of the first conducting section is exposed from the second insulating section. Therefore, the second conducting section can easily be formed to have electrical connection with the first conducting section. Accordingly, a highly reliable semiconductor device can efficiently be manufactured.

In this method of manufacturing a semiconductor device, the first conducting section can be formed so as to pass on a top surface of the protruding section, and the second insulating section can be formed so as to expose a part of the first conducting section overlapping the top surface.

In the method of manufacturing a semiconductor device, the second insulating section can be formed so that the exposed section of the first conducting section exposed from the second insulating section has a surface in the same level as a surface of the second insulating section. Accordingly, the second conducting section can evenly be formed. In other words, the second conducting section can be formed to be prevented from the stress concentration. Therefore, a highly reliable semiconductor device can be manufactured. In the method of manufacturing a semiconductor device, the second insulating section can be formed so that the exposed section of the first conducting section exposed from the second insulating section is disposed inside the second insulating section.

In the method of manufacturing a semiconductor device, the second insulating section can be formed so that the exposed section of the first conducting section exposed from the second insulating section protrudes from the surface of the second insulating section. Accordingly, the second conducting section can be formed to have a large contacting area with the first conducting section. Therefore, a semiconductor device having high reliability of electrical connections can be manufactured.

In the method of manufacturing a semiconductor device, the second insulating section can be formed to have a second protruding section, and the second conducting section can be formed to pass on a surface of the second protruding section, and the method of manufacturing a semiconductor device can further include the step of forming a third insulating section for partially covering the second conducting section above the second insulating section so as to expose at least a part of the second conducting section formed on the surface of the second protruding section, and the step of forming, on the third insulating section, a third conducting section electrically connected to the second conducting section via an exposed section of the second conducting section exposed from the third insulating section.

A semiconductor device according to another aspect of the invention includes a substrate, a first insulating section with a protruding section provided on the substrate, a first conducting section provided on the first insulating section so as to pass on a surface of the protruding section, a second insulating section for partially covering the first conducting section provided above the first insulating section so as to expose at least a part of the first conducting section formed on the surface of the protruding section, and a second conducting section provided on the second insulating section, and electrically connected to the first conducting section via an exposed section of the first conducting section exposed from the second insulating section. According to this aspect of the invention, a highly reliable semiconductor device with the first and the second conducting sections electrically connected to each other in a concrete manner can be provided.

In this semiconductor device, the first conducting section can be formed to pass on a top surface of the protruding section, and a part of the first conducting section overlapping the top surface can be exposed from the second insulating section.

In the semiconductor device, the exposed section of the first conducting section exposed from the second insulating section can be formed to have a surface in the same level as a surface of the second insulating section. Accordingly, the second conducting section can evenly be formed. In other words, the second conducting section can be formed to be prevented from the stress concentration. Therefore, a highly reliable semiconductor device can be provided.

In the semiconductor device, the exposed section of the first conducting section exposed from the second insulating section can be disposed inside the second insulating section.

In the semiconductor device, the exposed section of the first conducting section exposed from the second insulating section can protrude from the surface of the second insulating section. Accordingly, the contacting area between the first conducting section and the second conducting section can be enlarged. Therefore, a semiconductor device having high reliability of electrical connections can be provided.

In the semiconductor device, the second insulating section can be provided with a second protruding section, and the second conducting section can be provided so as to pass on a surface of the second protruding section, and the semiconductor device can further include a third insulating section for partially covering the second conducting section provided above the second insulating section so as to expose at least a part of the second conducting section formed on the surface of the second protruding section, and a third conducting section provided on the third insulating section, and electrically connected to the second conducting section via an exposed section of the second conducting section exposed from the third insulating section.

BRIEF DESCRIPTION OF THE DRAWINGS

The invention will now be described with reference to the accompanying drawings, wherein like numbers refer to like elements.

DESCRIPTION OF THE EMBODIMENTS

Hereinafter, embodiments of the invention will be described with reference to the accompanying drawings. Note, however, that the invention is not limited to the embodiments described below. Note also that the invention includes mutual combinations of the embodiments and their modified examples.

First Embodiment

A method of manufacturing a semiconductor device according to a first embodiment of the invention will hereinafter be explained. FIGS. 1A, 1B, 2, 3A through 3C, 4A, 4B, 5A, 5B, 6 and 7 are schematic views for explaining the method of manufacturing a semiconductor device according to the first embodiment of the invention.

Figure 1:
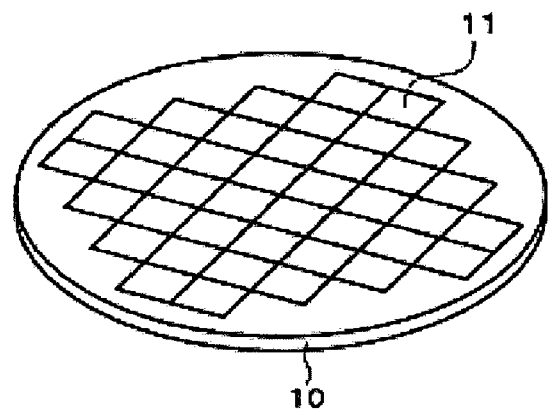
FIGS. 1A and 1B are schematic views for explaining a method of manufacturing a semiconductor device according to a first embodiment of the invention.
Figure 1:
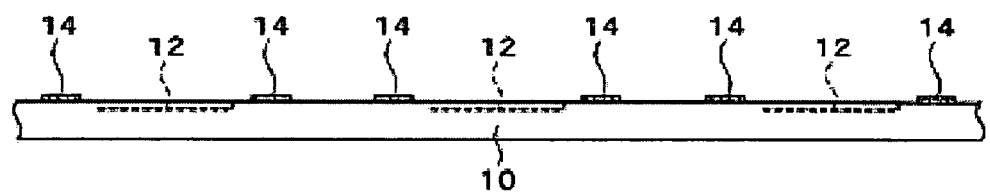
Figure 2:
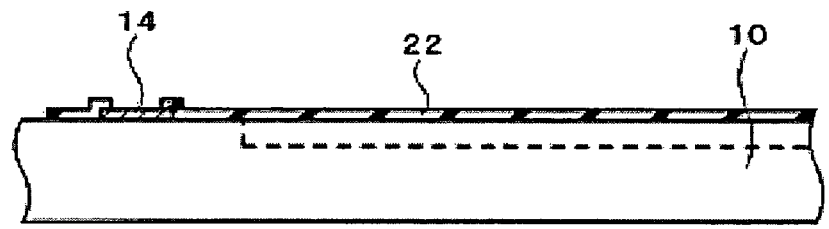
FIG. 2 is a schematic view for explaining the method of manufacturing a semiconductor device according to the first embodiment of the invention.

The method of manufacturing a semiconductor device according to the present embodiment can include the step of providing a semiconductor substrate 10 shown in FIGS. 1A and 1B. Note that FIG. 1A is a schematic view of the semiconductor substrate 10, and FIG. 1B is a partial enlarged view of a cross-sectional view of the semiconductor substrate 10. The semiconductor substrate 10 can be, for example, a silicon substrate. The semiconductor substrate 10 can shape like a wafer (See FIG. 1A.). The wafer shaped semiconductor substrate 10 can include a plurality of regions 11 each forming a semiconductor device. Alternatively, the semiconductor substrate 10 can shape like a chip. The semiconductor substrate 10 can include one or plural ("one" for the semiconductor chip, "plural" for the semiconductor wafer) integrated circuit(s) 12. The integrated circuit 12 can be formed for each of the regions 11. The configuration of the integrated circuit 12 is not particularly limited, but can include, for example, an active element such as a transistor or a passive component such as a resistor, an inductor or a capacitor. Further, the semiconductor substrate 10 includes a plurality of electrodes 14. The electrodes 14 can electrically be connected to the inside of the semiconductor substrate 10. The electrodes 14 can electrically be connected to the integrated circuits 12. Alternatively, the electrodes 14 can denote structures including pads not electrically connected to the integrated circuits 12. The electrodes 14 can be formed of metal such as aluminum or copper.

Figure 3:
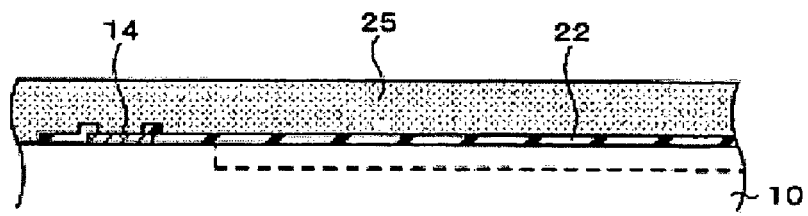
FIGS. 3A through 3C are schematic views for explaining the method of manufacturing a semiconductor device according to the first embodiment of the invention.
Figure 3:
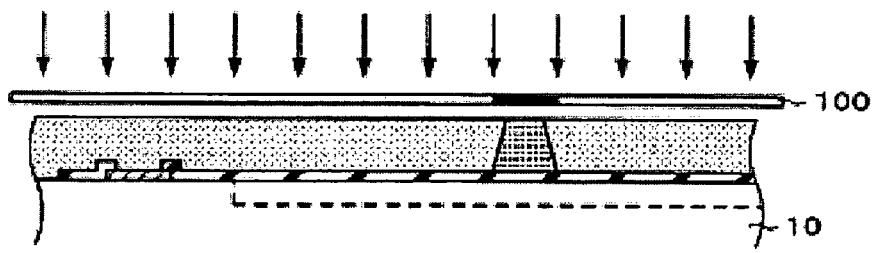
Figure 3:
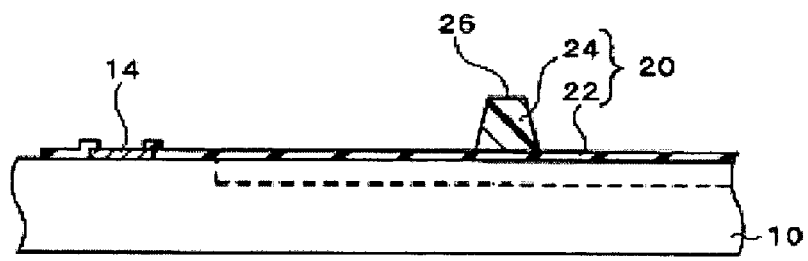

The method of manufacturing a semiconductor according to the present embodiment includes the step of forming a first insulating section 20 with a protruding section 24 on the semiconductor substrate 10 (See FIG. 3C.). Although the method of forming the first insulating section 20 is not particularly limited, the method of forming the insulating section 20 will hereinafter be exemplified with reference to FIGS. 2, and 3A through 3C. The method of forming the first insulating section 20 can include the step of forming an insulating layer 22 on the semiconductor substrate 10 as shown in FIG.

2. The insulating layer 22 can be formed of, for example, SiO2 or, SiN. In other words, the insulating layer 22 can be formed by oxidizing or nitriding the semiconductor substrate 10. In this case, the insulating layer 22 can be called as a passivation film. Alternatively, the insulating layer 22 can be formed of resin such as polyimide. In this case, the semiconductor substrate can previously be provided with a passivation film. Note that the insulating layer 22 provided with openings each exposing the corresponding one of the electrodes 14 (e.g., center portions of the electrodes 14). The method of forming the first insulating section 20 can further include the step of forming a protruding section 24 on the insulating layer 22. FIGS. 3A through 3C are schematic views for explaining a method of forming the protruding section 24. Firstly, as shown in FIG. 3A, a material 25 of the protruding section 24 is provided above the semiconductor substrate 10 (on the insulating layer 22). The protruding section 24 can be formed of resin, and in this case, the material 25 can be a precursor of the resin. And then, as shown in FIG. 3B, a mask 100 is disposed above the material 25, and is irradiated with energy. Note here that the mask 100 can have a structure for partially blocking the energy. As the material 25, a material having a property of increasing its resolvability to a developing solution in response to irradiation of the energy can be used. Namely, a positive type material can be utilized as the material 25. In this case, as shown in FIG. 3B, the mask 100 can have a structure of blocking the energy above an area in which the protruding section 24 is formed. And, the protruding section 24 shown in FIG. 3C can be formed by removing the area irradiated with the energy by the developing process, and then curing (polymerizing) the material 25. The insulating layer 22 and the protruding section 24 can integrally be called as a first insulating section 20. The protruding section 24 can be formed to taper towards the tip as shown in FIG. 3C. The protruding section 24 can be formed to taper towards the tip by utilizing the positive type of material as the material 25. Further, the protruding section 24 can be formed to have a flat top surface 26. The bottom surface and the top surface of the protruding section 24 can have circular shapes. In other words, the shape of the protruding section 24 can be a frustum of a cone. Alternatively, the bottom surface and the top surface of the protruding section 24 can have rectangular shapes. The material of the protruding section 24 is not particularly limited. The protruding section 24 can be made of, for example, polyimide resin, silicone modified polyimide resin, epoxy resin, silicone modified epoxy resin, benzocyclobutene (BCB), polybenzooxazole (PBO). The first insulating section 20 can be formed on the semiconductor substrate 10 through the above process. The first insulating section 20 can also be formed to have two parts made of materials different from each other. Note that, in the case in which the semiconductor substrate previously provided with the passivation film formed thereon, the first insulating section 20 can be formed only by the process of forming the protruding section 24. In other words, the first insulating section 20 can be formed by forming the protruding section 24 above the semiconductor substrate (on the passivation film).

Figure 4:
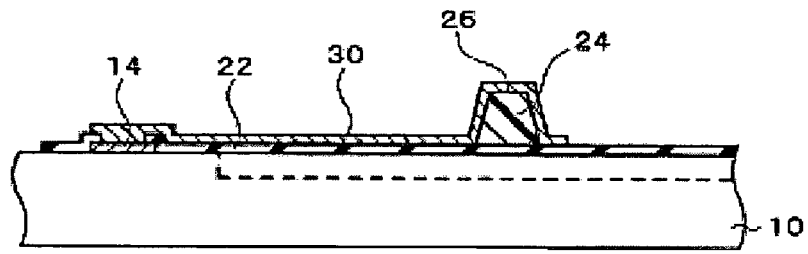
FIGS. 4A and 4B are schematic views for explaining the method of manufacturing a semiconductor device according to the first embodiment of the invention.
Figure 4:
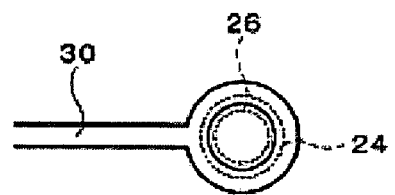

The method of manufacturing a semiconductor device according to the present embodiment includes the step of forming a first conducting section 30 as shown in FIGS. 4A and 4B. The first conducting section 30 is formed on the first insulating section 20 so as to pass on the surface of the protruding section 24. In this case, the first conducting section 30 can be formed so as to pass on the top surface 26 of the protruding section 24. The first conducting section 30 can be formed so as to pass on the insulating layer 22. Further, the first conducting section 30 can be formed so as to be electrically connected to the electrode 14. The method of forming the first conducting section 30 is not particularly limited, and either method already known to the public can be adopted. For example, the process of forming the first conducting section 30 can include the step of forming a conducting layer on the first insulating layer 20. The conducting layer can be formed by, for example, a sputtering process. The conducting layer can be formed in an area including a side surface of the protruding section 24. In the case in which the protruding section 24 has a tapered shape, the conducting layer can easily be formed on the side surface of the protruding section 24. The step of forming the first conducting section 30 can include the step of forming a patterned resist layer on the conducting layer. The resist layer can be formed so that the area, in the conducting layer, for forming the first conducting section 30 is exposed. The step of forming the first conducting section 30 can include the step of forming a metal layer on the conducting layer by a coating process. And, the first conducting section 30 can be formed by removing the resist and the conducting layer. Note that the first conducting section 30 can be formed so as to pass on the top surface 26 of the protruding section 24 (See FIG. 4A.). Further, the first conducting section 30 can be formed so as to cover the entire surface (the top surface 26 and the side surfaces) of the protruding section 24 (See FIG. 4B.). Note that FIG. 4B is a top view of the first conducting section 30, and shows the protruding section 24 and its top surface 26 with broken lines.

Figure 5:
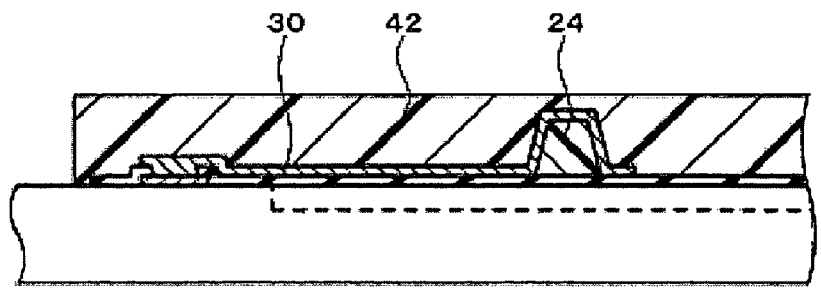
FIGS. 5A and 5B are schematic views for explaining the method of manufacturing a semiconductor device according to the first embodiment of the invention.
Figure 5:
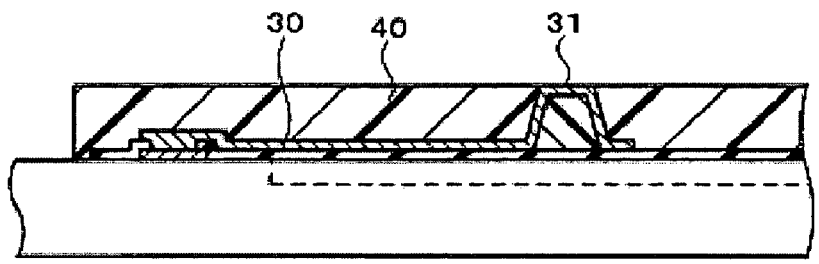

The method of manufacturing a semiconductor device according to the present embodiment includes the step of forming a second insulating section 40, above the first insulating section 20, for partially covering the first conducting section 30 (See FIG. 5B.). The second insulating section 40 is formed so as to expose at least a part of an area in the first conducting section 30 formed on the surface of the protruding section 24. In this case, an area of the first conducting section 30 exposed from the second insulating section 40 can be called as an exposed section 31. In the case in which the first conducting section 30 is formed so as to pass on the top surface 26 of the protruding section 24, the second insulating section 40 can be formed so that an area in the first conducting section 30 overlapping the top surface 26 of the protruding section 24 is exposed therefrom. The method of forming the second insulating section 40 is not particularly limited. For example, as shown in FIG. 5A, a insulating layer 42 is formed so as to cover the first insulating section 20 and the first conducting section 30, and then, as shown in FIG. 5B, the insulating layer 42 can be thinned to expose the first conducting section 30. Although the method of thinning the insulating layer 42 is not particularly limited, machine grinding or chemical etching can be utilized, for example. The second insulating section 40 can thus be formed. The second insulating section 40 can be formed to be thicker than the protruding section 24. In other words, the protruding section 24 can be disposed inside the second insulating section 40. And, the second insulating section 40 can be formed so that the exposed section 31 (the surface of the exposed section 31) is in the same level as the surface of the second insulating section 40. The surface of the exposed section 31 and the surface of the second insulating section 40 can be made in the same level by removing the surfaces of the first conducting section 30 and the insulating layer 42 in the process of thinning the insulating layer 42. Note that the second insulating section 40 can be formed so as not to expose the first insulating section 20 (the protruding section 24). Further, the material of the second insulating section 40 is not particularly limited, and either material exemplified as the material of the protruding section 24 can also be utilized.

Figure 6:
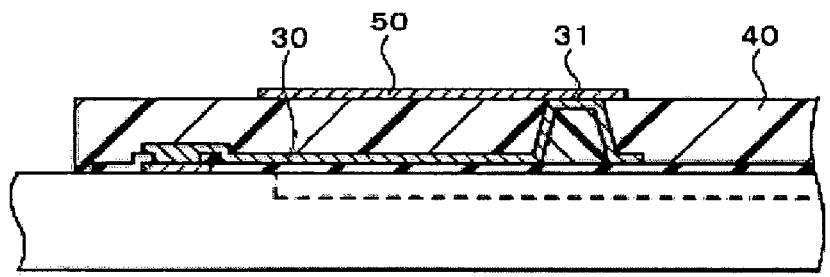
FIG. 6 is a schematic view for explaining the method of manufacturing a semiconductor device according to the first embodiment of the invention.
Figure 7:
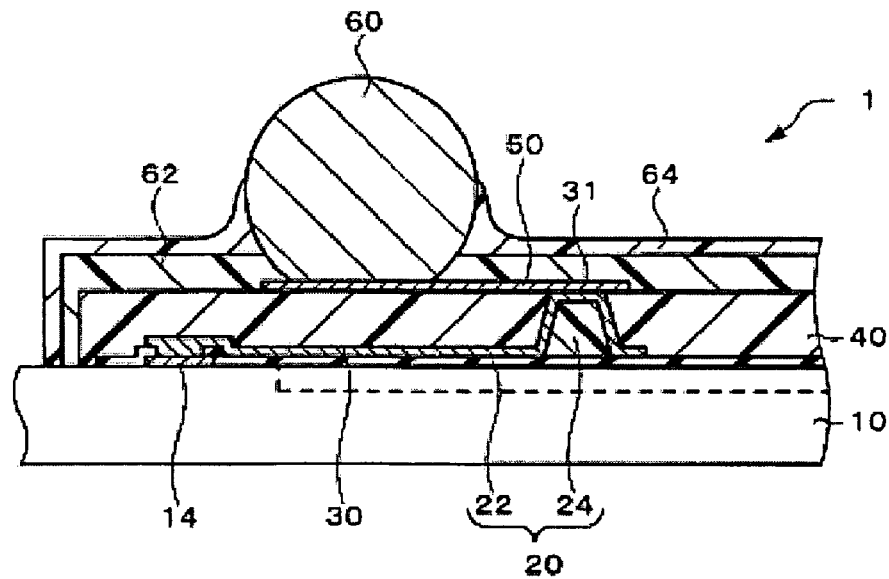
FIG. 7 is a schematic view for explaining the method of manufacturing a semiconductor device according to the first embodiment of the invention.

The method of manufacturing a semiconductor device according to the present embodiment includes the step of forming a second conducting section 50 on the second insulating section 40 as shown in FIG. 6. The second conducting section 50 is formed so as to be electrically connected to the first conducting section 30 via an are (the exposed section 31) of the first conducting section 30 exposed from the second insulating section 40. As explained above, a part of the first conducting section 30 is exposed from the second insulating section 40. Therefore, the second conducting section 50 can easily be formed to have electrical connection with the first conducting section 30.

Figure 8:
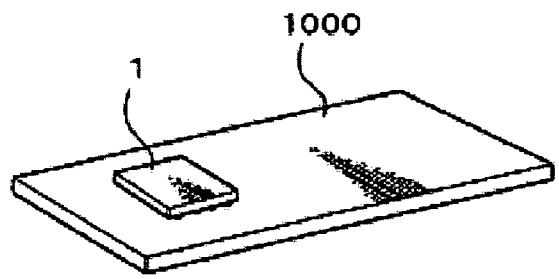
FIG. 8 is a perspective view showing a circuit board implementing a semiconductor device according to an embodiment of the invention.

The method of manufacturing a semiconductor device according to the present embodiment can include the step of forming an external terminal 60. The external terminal 60 can be formed on the second conducting section 50. The method of forming the external terminal 60 is not particularly limited. For example, a solder resist 62 with an opening is formed, and then the external terminal 60 can be formed inside the opening. And, a root reinforcing layer 64 for covering a part of external terminal 60 is formed, and then a semiconductor device 1 shown in FIG. 7 can be formed after an inspection process. Therefore, the second conducting section 50 can easily be formed to have electrical connection with the first conducting section 30. Therefore, according to the method of manufacturing a semiconductor device according to the present embodiment of the invention, a highly reliable semiconductor device can efficiently be manufactured. Note that the semiconductor device 1 can denote the semiconductor wafer as a whole, and can also denote the discrete region 11 obtained by dividing the semiconductor wafer. And, FIG. 8 shows a circuit board 1000 implementing the semiconductor device 1 separated into chips.

The semiconductor device 1 includes the semiconductor substrate 10. The semiconductor device 1 includes the first insulating section 20 with the protruding section 24 provided on the semiconductor substrate 10. Note that the first insulating section 20 can include the insulating layer 22, and in this case, the protruding section 24 can be formed on the insulating layer 22. Namely, the insulating layer 22 and the protruding section 24 can integrally be called as a first insulating section 20. Further, the insulating layer 22 can be called as a passivation film. The semiconductor device 1 includes the first conducting section 30. The first conducting section 30 is formed on the first insulating section 20. The first conducting section 30 can be formed so as to pass on the surface of the protruding section 24. The first conducting section 30 can be formed so as to pass on the top surface 26 of the protruding section 24. Further, the first conducting section 30 can be formed so as to pass on the insulating layer 22. The first conducting section 30 can be electrically connected to the electrode 14. The semiconductor device 1 includes the second insulating section 40 partially covering the first conducting section 30 provided on the first insulating section 20. The second insulating section 40 is formed so as to expose at least a part of an area in the first conducting section 30 formed on the surface of the protruding section 24. In this case, an area of the first conducting section 30 exposed from the second insulating section 40 can be called as an exposed section 31. Note that the exposed section 31 can be an area overlapping the top surface 26 of the protruding section 24. Further, the substrate of the exposed section 31 and the surface of the second insulating section 40 can be formed in the same level. The semiconductor device 1 includes the second conducting section 50. The second conducting section 50 is formed on the second insulating section 40. The second conducting section 50 is electrically connected to the first conducting section 30 via the exposed section 31. Accordingly, a highly reliable semiconductor device having the first conducting section 30 and the second conducting section 50 surely electrically connected to each other can be provided. Note that, in the case in which the exposed section 31 is in the same level as the second insulating section 40, the second conducting section 50 can evenly be formed. Therefore, the second conducting section 50 can be prevented from suffering from the stress, thus enhancing the reliability of the semiconductor device.

Modified Examples

A method of manufacturing a semiconductor device according to modified examples of the first embodiment of the invention will hereinafter be explained.

Figure 9:
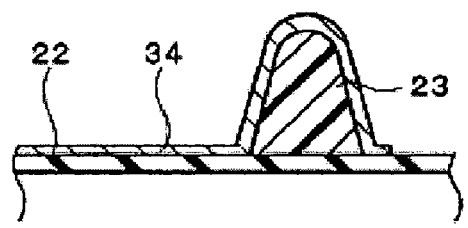
FIGS. 9A and 9B are schematic views for explaining a method of manufacturing a semiconductor device according to a first modified example of the first embodiment of the invention.
Figure 9:
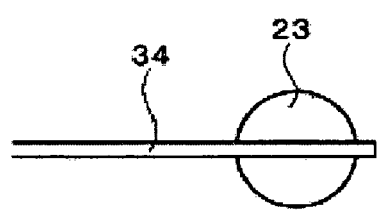

FIGS. 9A and 9B are schematic views for explaining a method of manufacturing a semiconductor device according to a first modified example of the first embodiment of the invention.

The method of manufacturing a semiconductor device according to the present modified example can include the step of forming a protruding section 23 on the insulating layer 22. In this case, the insulating layer 22 and the protruding section 23 can integrally be called as a first insulating section. The protruding section 23 is formed to have a curved surface on the tip portion as shown in FIG. 9A. And, the method of manufacturing a semiconductor device according to the present modified example includes the step of forming a first conducting section 34. The first conducting section 34 can be formed so as to have a constant width irrespective of inside or outside of an area overlapping the protruding section 23 as shown in FIG. 9B. This also makes it possible to manufacture a highly reliable semiconductor device. Note that FIG. 9A is a cross-sectional view of the protruding section 23 and the first conducting section 34, and FIG. 9B is a top view of what is shown in FIG. 9A.

Figure 10:
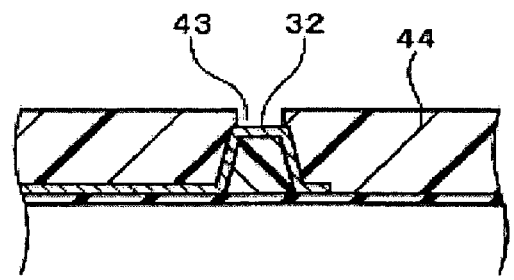
FIG. 10 is a schematic view for explaining a method of manufacturing a semiconductor device according to a second modified example of the first embodiment of the invention.
Figure 11:
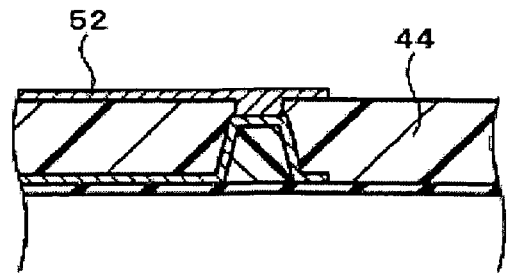
FIG. 11 is a schematic view for explaining the method of manufacturing a semiconductor device according to the second modified example of the first embodiment of the invention.

FIGS. 10 and 11 are schematic views for explaining a method of manufacturing a semiconductor device according to a second modified example of the first embodiment of the invention.

The method of manufacturing a semiconductor device according to the present modified example can include, as shown in FIG. 10, the step of forming an opening 43 in the insulating layer 42 (See FIG. 5A.). The opening 43 can be made so as to overlap the protruding section 24. Further, the opening 43 can be formed so as to expose a part of the first conducting section 30. In other words, the first conducting section 30 can be exposed through the opening 43. The second insulating section 44 can thus be formed. In this case, an area of the first conducting section 30 exposed from the second insulating section 44 can be called as an exposed section 32. And, the exposed section 32 can be disposed inside the second insulating section 44.

The method of manufacturing a semiconductor device according to the present modified example includes the step of forming a second conducting section 52 as shown in FIG. 11. The second conducting section 52 can be formed so that a part of the second conducting section fills in the opening 43 as shown in FIG. 11. Thus, since the contact area between the second conducting section 52 and the second insulating section 44 can be enlarged, and also the part formed inside the opening 43 functions as a wedge, a semiconductor device with higher reliability against the stress can be manufactured.

Figure 12:
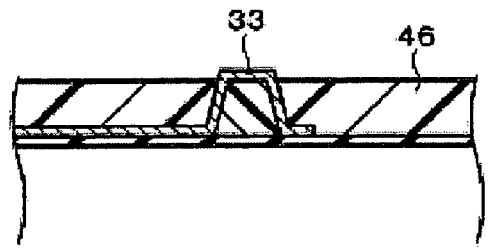
FIG. 12 is a schematic view for explaining a method of manufacturing a semiconductor device according to a third modified example of the first embodiment of the invention.
Figure 13:
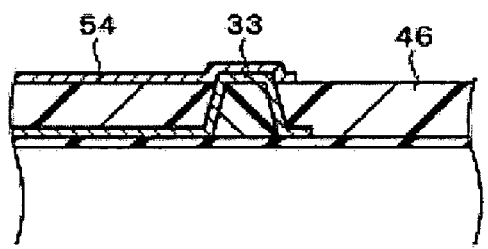
FIG. 13 is a schematic view for explaining the method of manufacturing a semiconductor device according to the third modified example of the first embodiment of the invention.

FIGS. 12 and 13 are schematic views for explaining a method of manufacturing a semiconductor device according to a third modified example of the first embodiment of the invention.

The method of manufacturing a semiconductor device according to the present modified example can include the step of forming a second insulating section 46 as shown in FIG. 12. The second insulating section 46 is formed so that an exposed section 33 of the first conducting section 30 is protruded form the surface of the second insulating section 46. Note that the second insulating section 46 can be formed to have the same thickness as that of the protruding section 24 as shown in FIG. 12. In other words, the second insulating section 46 can be formed so that the surface of the second insulating section 46 is disposed in the same level as the top surface 26 of the protruding section 24. Note that the second insulating section 46 can also be formed thinner than the protruding section 24 (not shown).

The method of manufacturing a semiconductor device according to the present modified example includes the step of forming a second conducting section 54 as shown in FIG. 13. The second conducting section 54 is formed to be electrically connected to the first conducting section 30 via the exposed section 33. Since the exposed section 33 protrudes from the surface of the second insulating section 46, the contact area between the first conducting section 30 (the exposed section 33) and the second conducting section 54 can be enlarged. Therefore, a semiconductor device having high reliability of electrical connections can be manufactured.

Second Embodiment

A method of manufacturing a semiconductor device according to a second embodiment of the invention will hereinafter be explained. FIGS. 14 through 18 are schematic views for explaining a method of manufacturing a semiconductor device according to the second embodiment of the invention.

Figure 14:
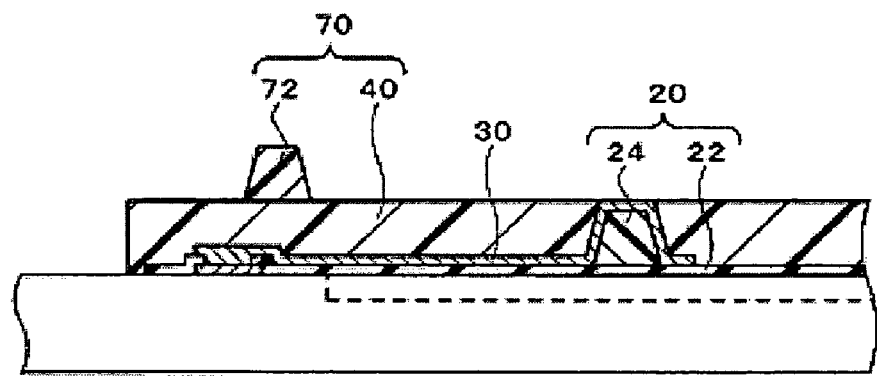
FIG. 14 is a schematic view for explaining a method of manufacturing a semiconductor device according to a second embodiment of the invention.

The method of manufacturing a semiconductor device according to the present embodiment includes the step of forming a second insulating section 70, above the first insulating section 20 (the insulating layer 22 and the protruding section 24), for partially covering the first conducting section 30 as shown in FIG. 14. The second insulating section 70 is formed to have a second protruding section 72. The method of forming the second insulating section 70 is not particularly limited. For example, the second protruding section 70 can be formed by forming the second protruding section 72 on the second insulating section 40 (See FIG. 5B.). In this case, the second insulating section 40 and the second protruding section 72 can integrally be called as the second insulating section 70. The method of forming the second protruding section 72 is not particularly limited, and the method explained above as the method of the protruding section 24 can also be adopted. The second insulating section 40 can be formed of the same material as the material of the second protruding section 72.

Figure 15:
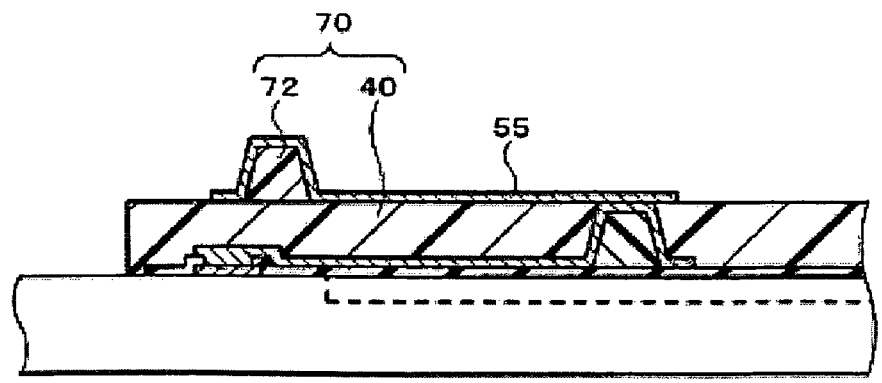
FIG. 15 is a schematic view for explaining the method of manufacturing a semiconductor device according to the second embodiment of the invention.

The method of manufacturing a semiconductor device according to the present embodiment includes the step of forming a second conducting section 55 on the second insulating section 70 as shown in FIG. 15. The second conducting section 55 is formed to pass on the surface of the second protruding section 72.

Figure 16:
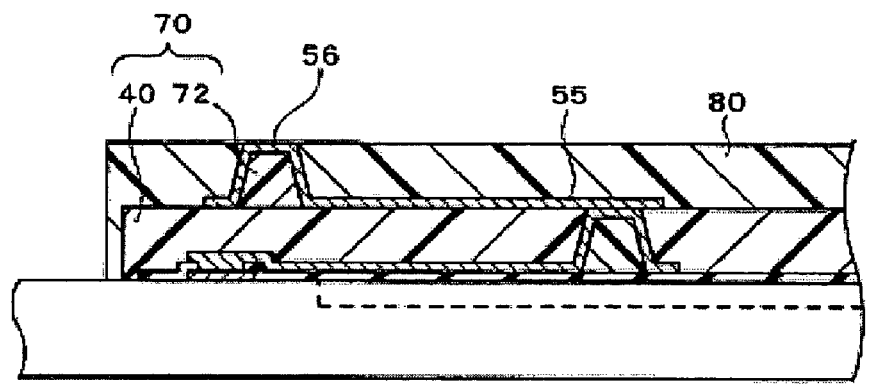
FIG. 16 is a schematic view for explaining the method of manufacturing a semiconductor device according to the second embodiment of the invention.

The method of manufacturing a semiconductor device according to the present embodiment includes the step of forming a third insulating section 80 for partially covering the second conducting section 55 on the second insulating section 70 as shown in FIG. 16. The third insulating section 80 is formed so as to expose at least a part of an area in the second conducting section 55 formed on the surface of the protruding section 72. In this case, an area of the second conducting section 55 exposed from the third insulating section 80 can be called as an exposed section 56.

Figure 17:
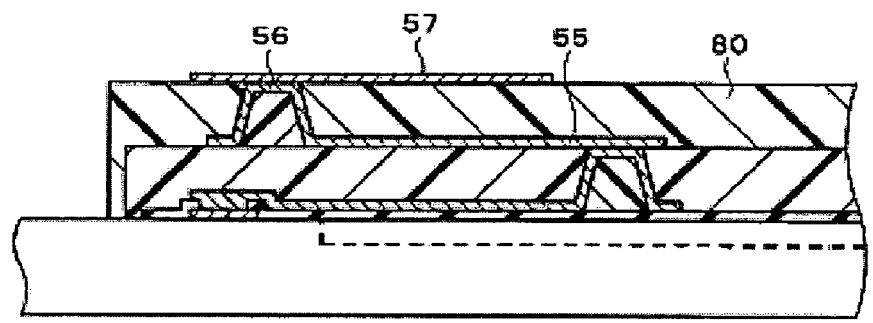
FIG. 17 is a schematic view for explaining the method of manufacturing a semiconductor device according to the second embodiment of the invention.
Figure 18:
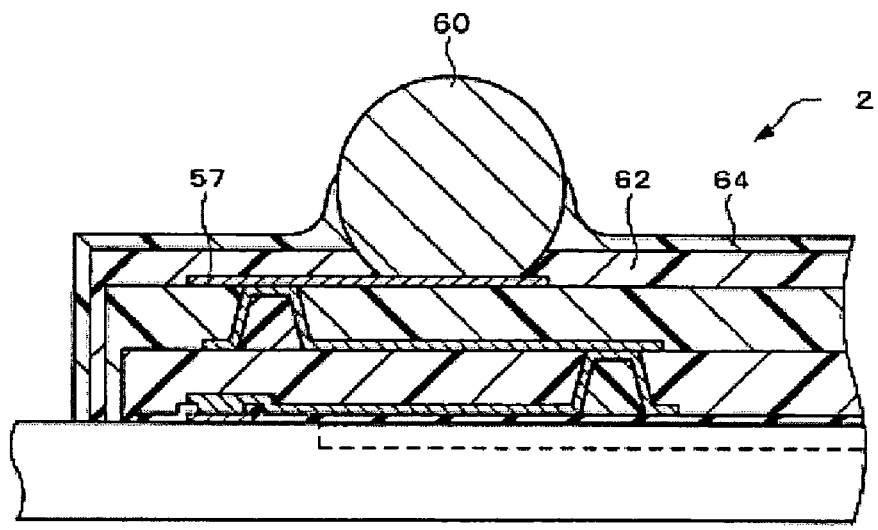
FIG. 18 is a schematic view for explaining the method of manufacturing a semiconductor device according to the second embodiment of the invention.

The method of manufacturing a semiconductor device according to the present embodiment includes the step of forming a third conducting section 57 electrically connected to the second conducting section 55 on the second insulating section 80 as shown in FIG. 17. The third conducting section 57 can electrically be connected to the second conducting section 55 via the exposed section 56. Since a part of the second conducting section 55 is exposed, the third conducting section 57 can easily be formed to be electrically connected to the second conducting section 55.

And, the semiconductor device 2 can be formed through the process for providing the external terminal 60 to the third conducting section 57 and the inspection process. By executing the above processes, a semiconductor device having an insulating section composed of plural layers stacked one another can efficiently be manufactured. Note that a semiconductor device having an insulating section composed of three or more layers stacked one another can be manufactured by repeating the above processes.

Modified Example

Figure 19:
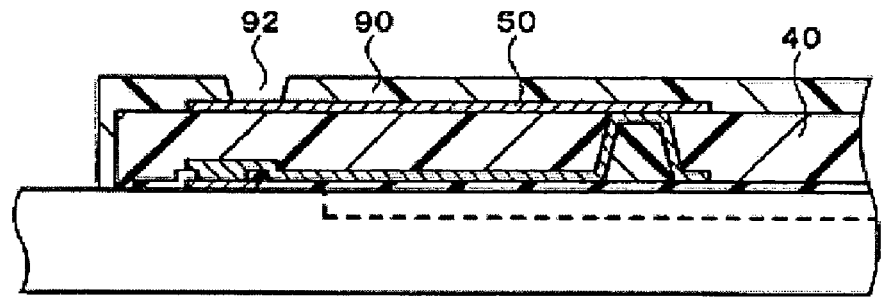
FIG. 19 is a schematic view for explaining a method of manufacturing a semiconductor device according to a modified example of the second embodiment of the invention.
Figure 20:
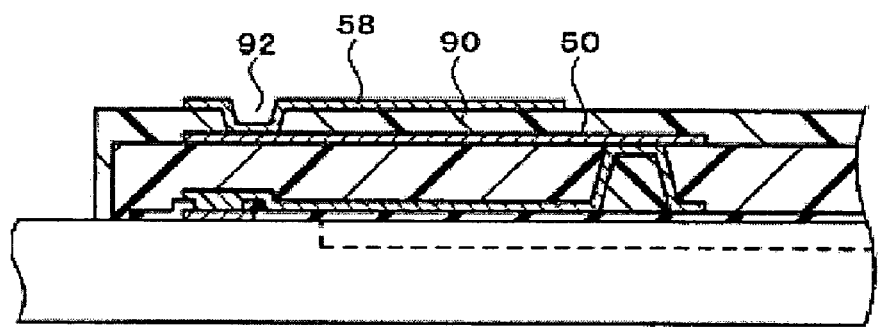
FIG. 20 is a schematic view for explaining the method of manufacturing a semiconductor device according to the modified example of the second embodiment of the invention.
Figure 21:
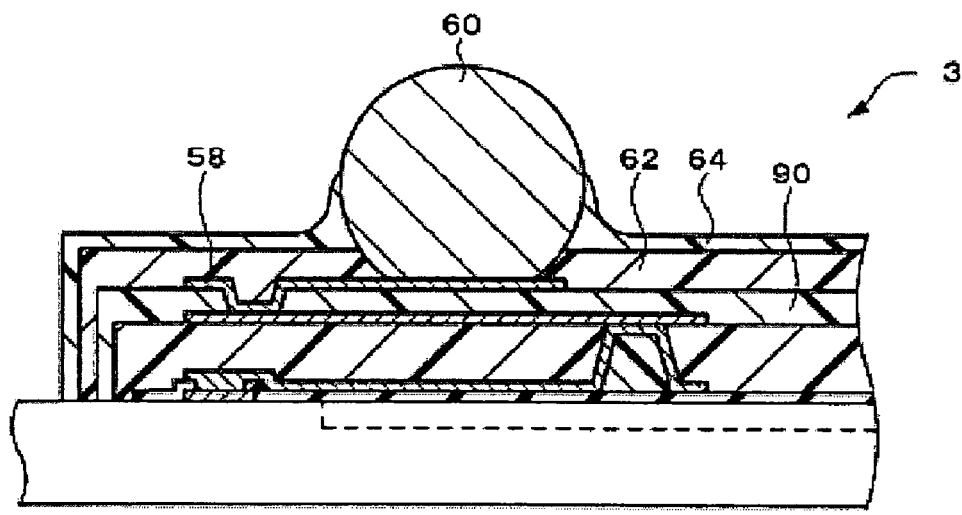
FIG. 21 is a schematic view for explaining the method of manufacturing a semiconductor device according to the modified example of the second embodiment of the invention.

A method of manufacturing a semiconductor device according to a modified example of the second embodiment of the invention will hereinafter be explained. FIGS. 19 through 21 are schematic views for explaining a method of manufacturing a semiconductor device according to the present modified example.

The method of manufacturing a semiconductor device according to the present modified example includes the step of forming a second conducting section 50 on the second insulating section 40 (See FIG. 6.). And, the method of manufacturing a semiconductor device according to the present modified example includes the step of forming a insulating layer 90 on the second insulating section 40 as shown in FIG. 19. The insulating layer 90 is provided with a through hole 92 for exposing a part of the second conducting section 50. The through hole 92 can be referred to as a via hole. The method of forming the insulating layer 90 is not particularly limited. For example, the insulating layer 90 can be formed by forming a insulating layer covering the second insulating layer 40 and the second conducting section 50, and then forming the through hole 92.

The method of manufacturing a semiconductor device according to the present modified example can include the step of forming a conducting section 58 on the insulating layer 90 as shown in FIG. 20. The conducting section 58 is formed so as to be electrically connected to the second conducting section 50. The conducting section 58 can electrically be connected to the second conducting section 50 via the through hole 92 of the insulating layer 90.

And, the semiconductor device 3 shown in FIG. 21 can be formed through the process for providing the external terminal 60 to the conducting section 58, the inspection process, and so on. By executing the above processes, a semiconductor device having an insulating section composed of plural layers stacked one another can be manufactured.

Note that the present invention is not limited to the embodiment described above, but various modifications are possible. For example, the present invention includes configurations (e.g., configurations having the same function, the same way, and the same result, or configurations having the same object and the same advantage) substantially the same as those described in the embodiment section. Further, the present invention includes configurations obtained by replacing a non-essential element of the configuration described in the embodiment section. Further, the present invention includes configurations offering the same advantage or configurations capable of achieving the same object as the configuration described in the embodiment section. Further, the present invention includes configurations obtained by adding technology known to the public to the configuration described in the embodiment section.

What is claimed is:

1. A semiconductor device, comprising:
   a substrate;
   a first insulating section having a protruding section and provided on the substrate;
   a first conducting section that is provided directly on the first insulating section, a first portion of the first conducting section being provided directly on the protruding section;
   a second insulating section that partially covers the first conducting section and that does not cover a first part of the first portion of the first conducting section;
   a second conducting section having a major face and being flat, a connecting part of the major face being electrically connected to the first conducting section via the first part of the first portion of the first conducting section, the major face, except for the connecting part, contiguously covering the second insulating section;
   a solder resist layer that contiguously and substantially covers the second conducting section and that has an opening exposing the second conducting section and laterally offset from the protruding section; and
   an external electrode that is formed at the opening of the solder resist layer.

2. The semiconductor device according to claim 1, wherein the first part of the first portion of the first conducting section is formed to pass on a top surface of the protruding section.

3. The semiconductor device according to claim 1, wherein the exposed section of the first conducting section exposed from the second insulating section is formed to have a surface in the same level as a surface of the second insulating section.

4. The semiconductor device according to claim 1, wherein the exposed section of the first conducting section exposed from the second insulating section is disposed inside the second insulating section.

5. The semiconductor device according to claim 1, wherein the first part of the first portion of the first conducting section protrudes from a first surface of the second insulating section, a first portion of the second conducting section being provided on the first surface of the second insulating section.

6. The semiconductor device according to claim 1, wherein at least a part of the surface of the protruding section is curved in a cross-sectional view.

7. A semiconductor device, comprising:
   a substrate;
   a first insulating section having a first protruding section and provided on the substrate;
   a first conducting section that is provided directly on the first insulating section, a first portion of the first conducting section being provided directly on the first protruding section and having a connecting part;
   a second insulating section that contiguously and partially covers the first conducting section and that does not cover the connecting part of the first conducting section, the second insulating section having a second protruding section that is laterally offset and remote from the first protruding section;
   a second conducting section that is electrically connected to the first conducting section via the connecting part of the first conducting section, a first portion of the second conducting section being provided directly on the second insulating section and being flat, a second portion of the second conducting section being provided directly on the second protruding section and having a connecting part;
   a third insulating section that contiguously and partially covers the second conducting section, and that does not cover the connecting part the second conducting section;
   a third conducting section that is electrically connected to the second conducting section via the connecting part of the second conducting section, a substantial portion of the third conducting section being provided directly on the third insulating section; and
   a solder resist layer that contiguously covers a substantial portion of the third conducting section, wherein the solder resist layer has an opening exposing the third conducting section and laterally offset and remote from the second protruding section;
   an external electrode that is formed at the opening of the solder resist layer and electrically connected with the third conducting section.

8. The semiconductor device according to claim 7, wherein a tip portion of the protruding section has a smoothly curved shape.

9. A semiconductor device, comprising:
   a substrate;
   a first insulating layer having a substantially uniform thickness and contiguously expanding on the substrate;
   a protruding section provided directly on the first insulating layer;
   a first conducting section provided directly on the first insulating layer and having a first part contiguously covering a surface of the protruding section, wherein the first conducting section is electrically connected with an electrode;
   a second insulating layer contiguously and substantially covering the first conducting section such that the first part of the first conducting section is exposed through the second insulating layer;
   a second conducting section provided directly on the second insulating layer, wherein the second conducting section is flat and has a substantially uniform thickness, wherein the second conduction section is electrically connected to the first conducting section via the exposed part of the first conducting section;
   a solder resist layer contiguously covering a substantial portion of the second conducting section, wherein the solder resist layer has an opening that is laterally offset and remote from the exposed part of the first conducting section; and
   an external electrode being provided at the opening of the solder resist layer and electrically connected to the second conducting section.

* * * * *